US012272564B2

(12) United States Patent
Lin et al.

(10) Patent No.: US 12,272,564 B2
(45) Date of Patent: Apr. 8, 2025

(54) TIN OXIDE AND TIN CARBIDE MATERIALS FOR SEMICONDUCTOR PATTERNING APPLICATIONS

(71) Applicant: Applied Materials, Inc., Santa Clara, CA (US)

(72) Inventors: Yung-chen Lin, Los Angeles, CA (US); Chi-I Lang, Cupertino, CA (US); Ho-yung Hwang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 510 days.

(21) Appl. No.: 17/456,255

(22) Filed: Nov. 23, 2021

(65) Prior Publication Data
US 2022/0189786 A1    Jun. 16, 2022

Related U.S. Application Data

(60) Provisional application No. 63/125,576, filed on Dec. 15, 2020.

(51) Int. Cl.
  *H01L 21/3213* (2006.01)
  *H01L 21/02* (2006.01)
  *H01L 21/033* (2006.01)
  *H01L 21/308* (2006.01)
  *H01L 21/311* (2006.01)

(52) U.S. Cl.
  CPC .. *H01L 21/32139* (2013.01); *H01L 21/02535* (2013.01); *H01L 21/0337* (2013.01); *H01L 21/3081* (2013.01); *H01L 21/31144* (2013.01); *H01L 21/32137* (2013.01)

(58) Field of Classification Search
  None
  See application file for complete search history.

(56) References Cited

U.S. PATENT DOCUMENTS

2018/0240667 A1*  8/2018  Yu .................. H01L 21/32137
2019/0212656 A1   7/2019  Dai et al.
(Continued)

FOREIGN PATENT DOCUMENTS

| JP | 2016143890 A | 8/2016 |
| KR | 20190095902 A | 8/2019 |
| WO | 2020214326 A1 | 10/2020 |

OTHER PUBLICATIONS

PCT Intl Application No. PCT/US2021/060531 International Search Report and Written Opinion dated Mar. 17, 2022.

*Primary Examiner* — Allan W. Olsen
(74) *Attorney, Agent, or Firm* — Patterson + Sheridan, LLP

(57) ABSTRACT

A method and apparatus for patterning semiconductor materials using tin-based materials as mandrels, hardmasks, and liner materials are provided. One or more implementations of the present disclosure use tin-oxide and/or tin-carbide materials as hardmask materials, mandrel materials, and/or liner material during various patterning applications. Tin-oxide or tin-carbide materials are easy to strip relative to other high selectivity materials like metal oxides (e.g., $TiO_2$, $ZrO_2$, $HfO_2$, $Al_2O_3$) to avoid influencing critical dimensions and generate defects. In addition, tin-oxide and tin-carbide have low refractive index, k-value, and are transparent under 663-nm for lithography overlay.

8 Claims, 9 Drawing Sheets

(56) References Cited

U.S. PATENT DOCUMENTS

| | | |
|---|---|---|
| 2019/0237341 A1 | 8/2019 | Yu et al. |
| 2020/0273705 A1* | 8/2020 | Singh ................ H01L 21/31122 |
| 2020/0335338 A1 | 10/2020 | Yang et al. |
| 2020/0335339 A1 | 10/2020 | Yang et al. |
| 2021/0265173 A1* | 8/2021 | Yu .................... H01L 21/67259 |
| 2021/0358751 A1* | 11/2021 | Gao ................... H01L 21/0276 |
| 2022/0005688 A1* | 1/2022 | Fung ....................... C23C 16/26 |

* cited by examiner

TIN OXIDE AND TIN CARBIDE MATERIALS FOR SEMICONDUCTOR PATTERNING APPLICATIONS

CROSS-REFERENCE TO RELATED APPLICATIONS

This application claims priority to the U.S. Provisional Patent Application Ser. No. 63/125,576 filed Dec. 15, 2020 of which is incorporated herein by reference in its entirety.

BACKGROUND

Field

Implementations described herein generally relate to a film stack and an etching process for etching the film stack with high selectivity and good profile control to patterning processes.

Description of the Related Art

Production of very large scale integration (VLSI) and ultra large scale integration (ULSI) semiconductor devices involves reliably producing submicron and smaller features. However, with the continued miniaturization of circuit technology, the dimensions of the size and pitch of circuit features, such as interconnects, have placed additional demands on processing capabilities. In order to further increase device and interconnect density, the multilevel interconnects at the heart of this technology involve precise imaging and placement of high aspect ratio features, such as vias and other interconnect structures. Additionally, forming sub-micron size features and interconnects with reduced waste of intermediate materials, such as resists and hardmask materials, is sought after.

As feature sizes have become smaller, the demand for higher aspect ratios, defined as the ratio between the depth of the feature and the width of the feature, has steadily increased to 10:1 and even greater. Developing a film stack and etch processes that are capable of reliably forming features with such high aspect ratios presents a significant challenge. Inaccurate control or low resolution of the lithography exposure and developing process may lead to poor critical dimension of the various layers utilized to transfer features into a film stack, resulting in unacceptable line width roughness (LWR). Large line width roughness (LWR) and undesired wiggling profile can cause inaccurate feature transfer to the film stack, thus, eventually leading to device failure and yield loss.

Furthermore, during etching of such film stacks, redeposition or build-up of byproducts or other materials generated during the etching process can accumulate on the top and/or sidewalls of the features being etched, thus undesirably blocking the opening of the feature being formed in the material layer. Different materials selected for the film stack can result in different amounts or profiles of the byproducts redeposited in the film stack. Furthermore, as the opening of the etched features are narrowed and/or sealed by the accumulated redeposition of material, the reactive etchants are prevented from reaching the lower surface of the features, thus limiting the aspect ratio that may be obtained. Additionally, the redeposition material or build-up of byproducts can randomly and/or irregularly adhere to the top surface and/or sidewalls of the features being etched, the resulting irregular profile and growth of the redeposition material can alter the flow path of the reactive etchants resulting in bowing or twisting profiles of the features formed in the material layer. Inaccurate profile or structural dimensions can result in collapse of the device structure, eventually leading to device failure and low product yield. In addition, poor etch selectivity to the materials included in the film stack can undesirably result in inaccurate profile control, thus eventually leading to device failure.

Therefore, there is a need in the art for a proper film stack and an etching method for etching features with targeted profile and small dimensions in the film stack.

SUMMARY

Implementations described herein generally relate to a film stack and an etching process for etching the film stack with high selectivity and good profile control to patterning processes.

In one aspect, a method of forming features on a substrate is provided. The method includes forming a mandrel layer on a substrate, wherein the mandrel layer is a tin-carbide layer or a tin-oxide layer. The method further includes patterning the mandrel layer. The method further includes conformally forming a spacer layer on the patterned mandrel layer. The method further includes patterning the spacer layer.

Implementations may include one or more of the following. The patterned mandrel layer is selectively removed from the patterned spacer layer. Forming the mandrel layer on the substrate includes depositing the mandrel layer using a physical vapor deposition (PVD) process, a chemical vapor deposition (CVD) process, or an atomic layer deposition (ALD) process. Patterning the mandrel layer, includes supplying a first gas mixture comprising a halogen-containing gas and oxygen gas and applying a first RF source power setting in the first gas mixture. The halogen-containing gas is selected from $Cl_2$ gas, HBr gas, or a combination thereof. The first gas mixture further comprises a passivation gas selected from $N_2$, $O_2$, COS, $SO_2$, or a combination thereof. The spacer layer includes a material different from the material of the mandrel layer and selected from silicon oxide, silicon nitride, a metal oxide, or polysilicon. The mandrel has a hardmask layer formed thereon. The hardmask layer comprises a material selected from polysilicon, nanocrystalline silicon, amorphous silicon, silicon oxide, silicon nitride, silicon oxynitride, silicon carbide, silicon oxycarbide, amorphous carbon, diamond-like carbon, titanium nitride, titanium oxide, titanium oxynitride, tantalum nitride, tantalum oxide, tantalum oxynitride, or any other suitable material, or a combination thereof. The substrate includes silicon oxide, silicon nitride, hafnium oxide, aluminum oxide, zirconium oxide, titanium oxide, or a combination thereof.

In another aspect, a method of forming features on a substrate is provided. The method includes forming a hardmask layer on a film stack formed over a substrate, wherein the hardmask layer comprises tin-oxide or tin carbide. The method further includes supplying a first etching gas mixture to the substrate; and etching the hardmask layer to form a patterned hardmask layer.

Implementations may include one or more of the following. The method further includes supplying a second etching gas mixture to the substrate and etching the film stack exposed by the patterned hardmask layer. The film stack includes multiple dielectric layers. The film stack includes oxide-nitride-oxide (ONO) layers. The film stack includes alternating layers of silicon and silicon germanium. The hardmask layer is selectively removed. The first etching gas mixture includes a halogen-containing gas. The halogen-containing gas is selected from $Cl_2$ gas, HBr gas, or a combination thereof. The first etching gas mixture further includes a passivation gas selected from $N_2$, $O_2$, COS, $SO_2$, or a combination thereof.

In yet another aspect, a method of forming features on a substrate is provided. The method includes forming a patterned hardmask layer on a film stack formed over a substrate, wherein the patterned hardmask layer includes carbon. The method further includes supplying a first etching gas mixture to the substrate. The method further includes etching the film stack exposed by the hardmask layer to form a patterned film stack. The method further includes forming a liner layer on the patterned hardmask layer and the patterned film stack, wherein the liner layer includes tin-oxide or tin-carbide.

Implementations may include one or more of the following. The liner layer is formed by an ALD process. The liner layer is exposed to wet chemistry or dry plasma to remove the liner layer. The patterned hardmask layer includes amorphous carbon, diamond-like carbon, or a combination thereof. The film stack includes multiple dielectric layers. The film stack includes oxide-nitride-oxide (ONO) layers. The film stack includes alternating layers of silicon and silicon germanium.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
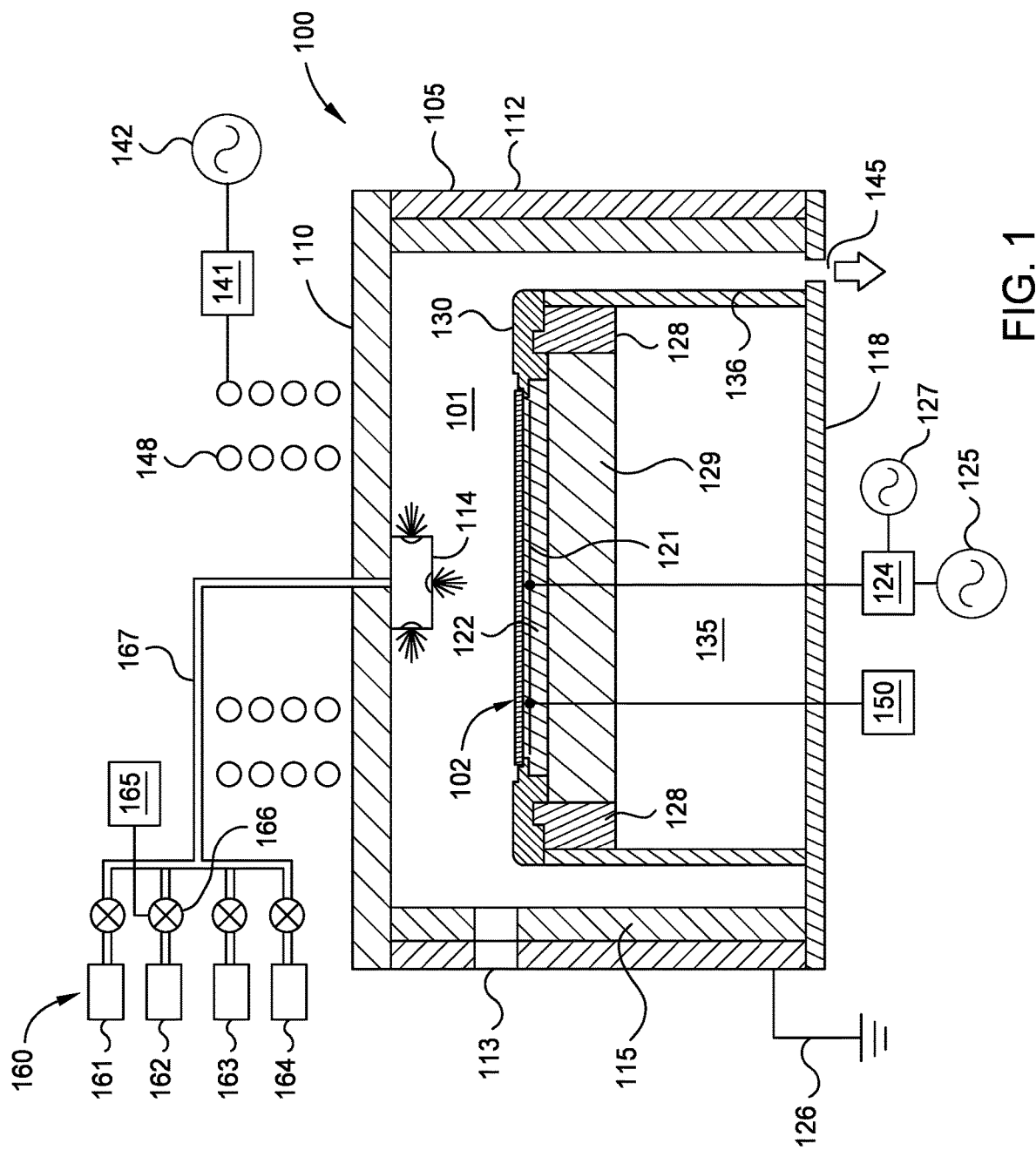
FIG. 1 illustrates a cross-sectional view of one example of a plasma processing chamber that can be utilized to perform an etching process according to one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes formation of high aspect ratio features. Certain details are set forth in the following description and in FIGS. 1-7D to provide a thorough understanding of various implementations of the disclosure. Other details describing well-known structures and systems often associated with formation of high aspect ratio features are not set forth in the following disclosure to avoid unnecessarily obscuring the description of the various implementations. In addition, the apparatus description described herein is illustrative and should not be construed or interpreted as limiting the scope of the implementations described herein.

Many of the details, operations, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein generally relate to a film stack and an etching process for etching the film stack with high selectivity and good profile control to patterning processes. One or more implementations of the present disclosure advantageously provide improved material selectivity in high-aspect ratio features by using tin-oxide (e.g., SnO, $SnO_2$) or tin-carbide (e.g., SnC) materials. One or more implementations of the present disclosure use tin-oxide and/or tin-carbide materials as hardmask materials, mandrel materials, and/or liner material during various patterning applications. Some implementations of the present disclosure improve the poor selectivity of carbon, high density carbon, and diamond-like carbon materials during capacitor etching of materials, for example, silicon oxide or silicon nitride, for memory applications due to the high young's modulus of tin-oxide and tin-carbide and non-volatile etching by-products (e.g., $SnF_4$). Tin-oxide or tin-carbide materials are easy to strip relative to other high selectivity materials like metal oxides (e.g., $TiO_2$, $ZrO_2$, $HfO_2$, $Al_2O_3$) to avoid influencing critical dimensions and generate defects. Due to the potential to provide high selectivity over carbon, tin-oxide and tin-carbide materials can be used for deep etch hardmask in memory applications. In addition, tin-oxide and tin-carbide have low refractive index, k-value, and are transparent under 663-nm for lithography overlay. Further, carbon, tin and SnO (oxidation in air) can be easily removed by dry plasma etching or wet etchants, which helps provide accurate critical dimension control for multi-patterning. Tin and tin-oxide can be easily removed during chamber cleaning to reduce the defects in the production process and also increase chamber productivity.

While the particular apparatus in which the implementations described herein can be practiced is not limited, it is particularly beneficial to practice the implementations in a SYM3® etch system sold by Applied Materials, Inc., Santa Clara, Calif. Additionally, other available etch systems can also benefit from implementations described herein.

A "substrate" as used herein, refers to a surface of a material, or a portion of a surface or a material upon which film processing is performed during a fabrication process. For example, a substrate surface on which processing can be performed include materials such as silicon, silicon oxide, silicon nitride, strained silicon, silicon on insulator (SOI), carbon doped silicon oxides, amorphous silicon, doped silicon, doped amorphous silicon, poly silicon, doped poly silicon, germanium, gallium arsenide, glass, sapphire, and any other materials such as metals, metal nitrides, metal alloys, and other conductive materials, depending on the application. Substrates include, without limitation, semiconductor wafers. In addition to film processing directly on the surface of the substrate itself, in the present disclosure, any of the film processing steps disclosed can also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate can be a silicon wafer, e.g., a 200-mm wafer, a 300-mm wafer, or a 450-mm wafer, including wafers having one or more layers of material such as dielectric, conducting, or semi-conducting material deposited thereon. A patterned substrate can have "features" such as vias, openings, or contact holes, which can be characterized by one or more of narrow and/or re-entrant openings, constrictions within the features, and high aspect ratios. The features can be formed in one or more of the above-described layers. One example of a feature is a hole or via in a semiconductor substrate or a layer on the substrate. Another example is a trench in a substrate or layer. In some implementations, the feature can have an under-layer, such as a barrier layer or an adhesion layer. Non-limiting examples of under-layers include dielectric layers and conducting layers, e.g., silicon oxides, silicon nitrides, silicon carbides, metal oxides, metal nitrides, metal carbides, and metal layers.

In some implementations, types of substrates fabricated from performing disclosed implementations can depend on the aspect ratios of features on the substrate prior to performing disclosed implementations. Aspect ratios are a comparison of depth of a feature to the critical dimension of the feature (e.g., width/diameter). In some implementations, features on a substrate can have an aspect ratio of at least about 2:1, at least about 3:1, at least about 4:1, at least about 6:1, at least about 10:1, at least about 20:1, or higher. The feature can also have a dimension near the opening, e.g., an opening diameter or line width of between about 5 nm to 500 nm, for example between about 25 nm and about 300 nm.

One or more implementations of the disclosure generally provide structures, which include high aspect ratio structures formed by patterning dielectric materials as, can be implemented in memory structures. By way of example, a high aspect ratio feature formed in accordance with implementations of the present disclosure can be a memory type semiconductor device, such as a NAND type memory device.

FIG. 1 is a simplified cutaway view for of one example of a plasma processing chamber 100 suitable for patterning a material layer as well as forming a material layer disposed on a substrate 102 in the plasma processing chamber 100. The plasma processing chamber 100 is suitable for performing an etching process as described herein. One example of the plasma processing chamber 100 that can be adapted to benefit from the disclosure is a CENTRIS® SYM3® processing chamber, available from Applied Materials, Inc., located in Santa Clara, California. It is contemplated that other process chambers, including those from other manufactures, can be adapted to practice implementations of the disclosure.

The plasma processing chamber 100 includes a chamber body 105 having a processing volume 101 defined therein. The chamber body 105 has sidewalls 112 and a bottom 118, which are coupled to ground 126. The sidewalls 112 have a liner 115 to protect the sidewalls 112 and extend the time between maintenance cycles of the plasma processing chamber 100. The dimensions of the chamber body 105 and related components of the plasma processing chamber 100 are not limited and can be proportionally larger than the size of the substrate 102 to be processed therein. Examples of substrate sizes include 200 mm diameter, 250 mm diameter, 300 mm diameter and 450 mm diameter, among others.

The chamber body 105 supports a chamber lid assembly 110 to enclose the processing volume 101. The chamber body 105 can be fabricated from aluminum or other suitable materials. A substrate access port 113 is formed through the sidewall 112 of the chamber body 105, facilitating the transfer of the substrate 102 into and out of the plasma processing chamber 100. The substrate access port 113 can be coupled to a transfer chamber and/or other chambers of a substrate processing system (not shown).

A pumping port 145 is defined in the chamber body 105 and connected to the processing volume 101. A pumping device (not shown) is coupled through the pumping port 145 to the processing volume 101 to evacuate and control the pressure of the processing volume 101. The pumping device can include one or more pumps and throttle valves.

A gas panel 160 is coupled by a gas line 167 to the chamber body 105 to supply process gases into the processing volume 101. The gas panel 160 can include one or more process gas sources 161, 162, 163, 164 and can additionally include inert gases, non-reactive gases, and reactive gases. Examples of process gases that can be provided by the gas panel 160 include, but are not limited to, oxygen-containing gases including $O_2$, $H_2O$, $H_2O_2$, $O_3$, $N_2O$, $NO_2$; halogen-containing gases including $Cl_2$, HCl, HF, $F_2$, $Br_2$, HCl, HBr, $SF_6$, $NF_3$; passivation gases including nitrogen ($N_2$), carbonyl sulfide (COS), and sulfur dioxide ($SO_2$); and inert gases including argon, helium. Additionally, process gasses can include nitrogen, chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, $N_2$, $NO_2$, $N_2O$ and $H_2$, among others.

Valves 166 control the flow of the process gases from the sources 161, 162, 163, 164 from the gas panel 160 and are managed by a system controller 165. The flow of the gases supplied to the chamber body 105 from the gas panel 160 can include combinations of the gases.

The chamber lid assembly 110 can include a nozzle 114. The nozzle 114 has one or more ports for introducing the process gases from the sources 161, 162, 164, 163 of the gas panel 160 into the processing volume 101. After the process gases are introduced into the plasma processing chamber 100, the gases are energized to form plasma. An antenna 148, such as one or more inductor coils, can be provided adjacent to the plasma processing chamber 100. An antenna power supply 142 can power the antenna 148 through a match circuit 141 to inductively couple energy, such as RF energy, to the process gas to maintain a plasma formed from the process gas in the processing volume 101 of the plasma processing chamber 100. Alternatively, or in addition to the antenna power supply 142, process electrodes below the substrate 102 and/or above the substrate 102 can be used to capacitively couple RF power to the process gases to maintain the plasma within the processing volume 101. The operation of the antenna power supply 142 can be controlled by a controller, such as the system controller 165, which also controls the operation of other components in the plasma processing chamber 100.

A substrate support pedestal 135 is disposed in the processing volume 101 to support the substrate 102 during processing. The substrate support pedestal 135 can include an electrostatic chuck (ESC) 122 for holding the substrate 102 during processing. The ESC 122 uses the electrostatic attraction to hold the substrate 102 to the substrate support pedestal 135. The ESC 122 is powered by an RF power supply 125 integrated with a match circuit 124. The ESC 122 includes an electrode 121 embedded within a dielectric body. The electrode 121 is coupled to the RF power supply 125 and provides a bias, which attracts plasma ions, formed by the process gases in the processing volume 101, to the ESC 122 and substrate 102 positioned thereon. The RF power supply 125 can cycle on and off, or pulse, during processing of the substrate 102. The ESC 122 has an isolator 128 for the purpose of making the sidewall of the ESC 122 less attractive to the plasma to prolong the maintenance life cycle of the ESC 122. Additionally, the substrate support pedestal 135 can have a cathode liner 136 to protect the sidewalls of the substrate support pedestal 135 from the plasma gases and to extend the time between maintenance of the plasma processing chamber 100.

Furthermore, the electrode 121 is coupled to a power source 150. The power source 150 provides a chucking voltage of about 200 volts to about 2,000 volts to the electrode 121. The power source 150 can also include a system controller, for example, the system controller 165, for controlling the operation of the electrode 121 by directing a DC current to the electrode 121 for chucking and de-chucking the substrate 102.

The ESC 122 can include heaters disposed therein and connected to a power source (not shown), for heating the substrate, while a cooling base 129 supporting the ESC 122 can include conduits for circulating a heat transfer fluid to maintain a temperature of the ESC 122 and the substrate 102 disposed thereon. The ESC 122 is configured to perform in the temperature range dictated by the thermal budget of the device being fabricated on the substrate 102. For example, the ESC 122 can be configured to maintain the substrate 102 at a temperature of −50 degrees Celsius to about 250 degrees Celsius, for example, from about 25 degrees Celsius to about 150 degrees Celsius.

The cooling base 129 is provided to assist in controlling the temperature of the substrate 102. To mitigate process drift and time, the temperature of the substrate 102 can be maintained substantially constant by the cooling base 129 throughout the time the substrate 102 is in the plasma processing chamber 100. In one implementation, the temperature of the substrate 102 is maintained throughout the etching process at −50 degrees Celsius to about 250 degrees Celsius, for example, from about 25 degrees Celsius to about 150 degrees Celsius.

A cover ring 130 is disposed on the ESC 122 and along the periphery of the substrate support pedestal 135. The cover ring 130 is configured to confine etching gases to a targeted portion of the exposed top surface of the substrate 102, while shielding the top surface of the substrate support pedestal 135 from the plasma environment inside the plasma processing chamber 100. Lift pins (not shown) are selectively moved through the substrate support pedestal 135 to lift the substrate 102 above the substrate support pedestal 135 to facilitate access to the substrate 102 by a transfer robot (not shown) or other suitable transfer mechanism.

The system controller 165 can be utilized to control the process sequence, regulating the gas flows from the gas panel 160 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines can also be stored and/or executed by a second controller (not shown) that is collocated with the plasma processing chamber 100.

Figure 2:
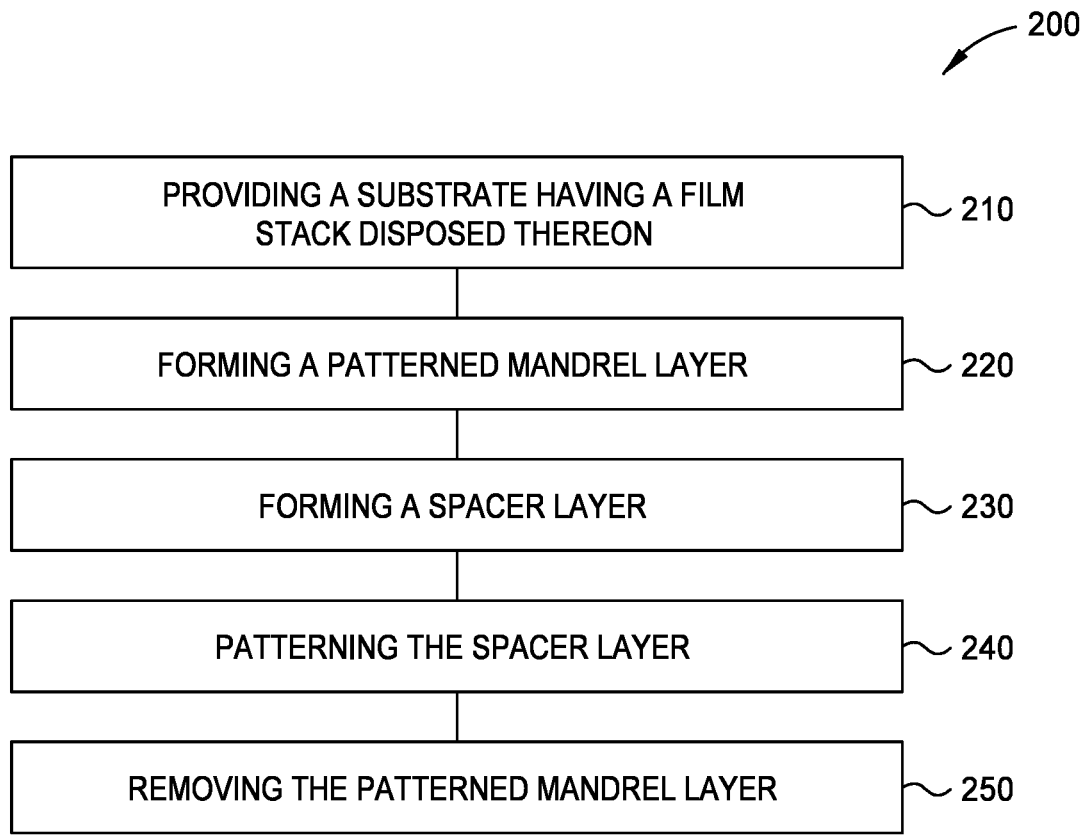
FIG. 2 illustrates a flow diagram of a method for performing a high aspect ratio feature patterning process according to one or more implementations of the present disclosure.

FIG. 2 illustrates a flow diagram of a method 200 for performing a high aspect ratio feature patterning process utilizing tin-based mandrel materials according to one or more implementations of the present disclosure. FIGS. 3A-3D illustrate cross-sectional views of a film stack 300 at various stages of a high aspect ratio feature patterning process according to the method 200. The mandrel materials include tin-oxide (e.g., SnO, $SnO_2$) or tin-carbide (e.g., SnC) materials. The method 200 may be utilized to form features with targeted critical dimensions and profiles, such as a contact structure, gate structure, NAND structure, or interconnection structure for logic or memory devices as needed. Alternatively, the method 200 may be beneficially utilized to pattern other types of structures.

Figure 3A:
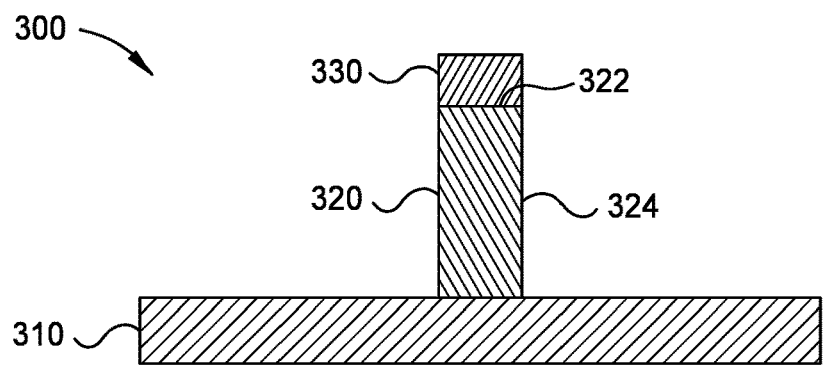
FIGS. 3A-3D illustrate various stages of a high aspect ratio feature patterning process according to one or more implementations of the present disclosure.

The method 200 begins at operation 210 by providing a film stack 300 having a patterned hardmask layer 330 disposed on a patterned mandrel layer 320, which is disposed on a substrate 310, as shown in FIG. 3A. The patterned hardmask layer 330 can be patterned using a patterned photoresist layer (not shown) having defined openings, exposing a portion of the hardmask layer for etching.

During operation 220, the patterned hardmask layer 330 is then used to form the patterned mandrel layer 320. The mandrel patterning process of operation 220 can be performed in a plasma processing chamber, for example, the plasma processing chamber 100 shown in FIG. 1. The mandrel patterning process is performed by supplying a first gas mixture that selectively removes the material of the mandrel layer selectively at a higher rate than the material of the patterned hardmask layer 330 to form the sidewalls 324 of the patterned mandrel layer 320. The first gas mixture supplied during the mandrel patterning process includes reactive etchants utilized for etching a tin-carbide or tin-oxide material.

The first gas mixture can include a halogen-containing gas. The halogen-containing gas can be selected from the group of HBr, chlorine gas ($Cl_2$), carbon and fluorine containing gas, such as $CF_4$, $CHF_3$, $C_4F_8$, or a combination thereof. The first gas mixture can further include an oxygen-containing gas or $H_2$. The oxygen-containing gas can be selected from the group of $O_2$, $H_2O$, $H_2O_2$, $O_3$, $N_2O$, $NO_2$, CO, or a combination thereof. The first gas mixture can further include a passivation gas. The passivation gas can be selected from the group of nitrogen ($N_2$), sulfur dioxide ($SO_2$), carbonyl sulfide (COS), or a combination thereof. The first gas mixture is configured to remove material from the mandrel layer to form the sidewalls 324 of the patterned mandrel layer 320. Not to be bound by theory but it is believed that inclusion of the passivation gas helps achieve a vertical etch profile of the sidewalls 324. In one particular example, the first gas mixture includes $O_2$/at least one of HBr and chlorine gas ($Cl_2$)/at least one of $N_2$, COS, and $SO_2$.

Several process parameters are regulated while the first gas mixture is supplied into the plasma processing chamber, for example, the plasma processing chamber 100 shown in FIG. 1. In one implementation, the chamber pressure in the presence of the first gas mixture is regulated. In one example, a process pressure in the etch chamber is regulated from about 1 mTorr to about 80 mTorr, for example, from about 3 mTorr to about 60 mTorr. RF source and bias power can be applied to maintain a plasma formed from the first gas mixture. For example, RF source power of from about 100 Watts to about 3000 Watts (from about 200 Watts to about 1500 Watts; from about 200 Watts to about 1,000 Watts; or from about 500 Watts to about 3,000 Watts) can be applied to an inductively coupled antenna source to maintain a plasma inside the plasma processing chamber. RF bias power of about less than 1500 Watts (from about 40 Watts to 400 Watts; from about 150 Watts to about 400 Watts; or from about 500 Watts to about 1,500 Watts) can be applied while supplying the first gas mixture. The first gas mixture can be flowed into the chamber at a rate from about 50 sccm to about 1,000 sccm. A temperature of the substrate can be maintained from about −50 degrees Celsius to about 250 degrees Celsius, for example, from about −20 degrees Celsius to about 80 degrees Celsius.

While supplying the first gas mixture, the RF source and bias power range may be varied to facilitate predominately removing certain portions of the mandrel layer. For example, the RF source power may be turned up, for example, from a first RF source power setting to a second RF source power setting, while the RF bias power may be turned down, for example, from a first RF bias power setting to a second RF bias power setting, as needed while supplying the first gas mixture. In one example, after the first RF source and bias power setting has been performed for a time period from about 5 seconds to about 20 seconds, the first RF source and bias power settings may be transitioned to the second RF source and bias power setting to continue the patterning process. In one example, the second RF source power setting is from about 30% to about 80% higher than the first RF source power setting. The second bias power setting can be from about 30 percent to about 70 percent less than the first bias power setting.

In one particular example, the first RF source power setting is from about 500 Watts to about 600 Watts and the first RF bias power setting is from about 50 Watts to about 150 Watts. The second RF source power setting is from about 700 Watts to about 900 Watts and the second RF bias power setting is from about 20 Watts to about 100 Watts.

In some implementations, the patterned hardmask layer 330 may be a first type of dielectric layer selected from a group of polysilicon, nanocrystalline silicon, amorphous silicon, silicon oxide, silicon nitride, silicon oxynitride, silicon carbide, silicon oxycarbide, amorphous carbon, diamond-like carbon, titanium nitride, titanium oxide, titanium oxynitride, tantalum nitride, tantalum oxide, tantalum oxynitride, or any other suitable materials. In one particular example, the first type of dielectric layer selected to form the patterned hardmask layer 330 is a carbon-containing layer, such as amorphous carbon, diamond-like carbon, SiOC, or the like. In some implementations where the mandrel material is tin-oxide, the hardmask layer 330 can include carbon-based films (e.g., spin-on carbon films, amorphous carbon films, carbon-based photo-resist, extreme ultraviolet ("EUV") resist materials, dielectric materials (e.g., SiO, SiN, SiON, SiOCN, or SiOC), and silicon-containing films (e.g., silicon or poly-silicon films). In some implementations where the mandrel material is tin-carbide, the hardmask layer 330 includes patterned dielectrics (e.g., SiO, SiN, SiON, SiOCN, or SiOC) or silicon-containing films (e.g., silicon or poly-silicon films).

The patterned mandrel layer 320 includes a material different from the patterned hardmask layer 330. The patterned mandrel layer 320 is a tin-containing material. In one example, the patterned mandrel layer 320 is a tin-oxide layer (e.g., SnOx, SnO, or $SnO_2$). In another example, the patterned mandrel layer 320 is a tin-carbide layer (e.g., Sn—C or Sn(C) containing bonding of Sn—Sn, Sn—C, and/or C—C). Not to be bound by theory, bit it is believed that the strong bonding of Sn—C helps maintain the vertical profile of the sidewalls 324 of the patterned mandrel layer 320. The patterned mandrel layer 320 can be formed by any suitable deposition process, such as PVD, CVD, ALD, or other suitable deposition techniques. The patterned mandrel layer 320 is used to pattern subsequently deposited spacer material. In one example, the patterned mandrel layer 320 has a thickness between about 5 nm and about 200 nm, for example, from about 40 nm to about 100 nm.

Figure 3B:
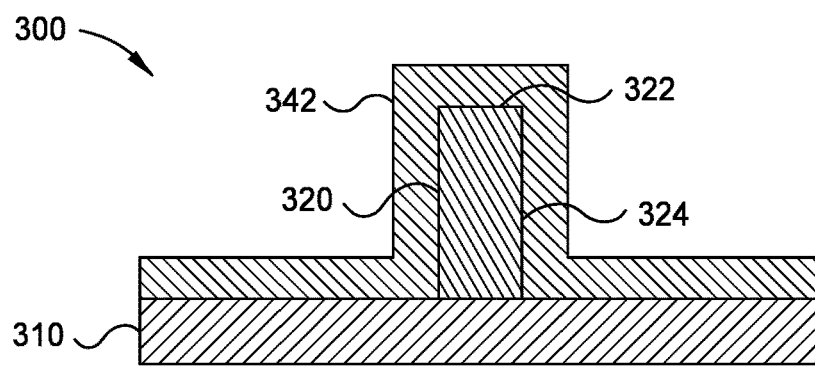

In some implementations, as shown in FIG. 3B, the patterned hardmask layer 330 is removed after forming the patterned mandrel layer 320. In some implementations, the patterned hardmask layer 330 remains on the patterned mandrel layer 320 and can be removed later. In some implementations, the patterned hardmask layer 330 is consumed while patterning the patterned mandrel layer 320.

In some implementations, the substrate 310 can include a dielectric layer utilized to form a contact layer, a dual damascene structure, or any suitable materials. Suitable examples of the dielectric layer include carbon-containing silicon oxides (SiOC), tetraethyl orthosilicate (TEOS), thermal silicon oxide, polymer materials, such as polyamides, SOG, USG, silicon oxide, silicon nitride (e.g., SiNx), silicon oxynitride (SiON), silicon carbide (SiC), silicon carbonnitride (SiCN), silicon oxycarbide, boron nitride (BN), high-k dielectrics including, for example, hafnium oxide (e.g., HfOx, $HfO_2$), aluminum oxide (e.g., $Al_xO_y$, $Al_2O_3$), zirconium oxide ($ZrO_2$), titanium oxide, or a combination thereof. In one example, the substrate 310 includes silicon oxide, silicon nitride, hafnium oxide, aluminum oxide, zirconium oxide, titanium oxide, or a combination thereof.

At operation 230, a spacer layer 340 is formed over the substrate 310 and the patterned mandrel layer 320 as shown in FIG. 3B. The spacer layer 340 is formed from a material that is different than the material of the patterned mandrel layer 320 and the substrate 310. In some implementations, the spacer layer 340 includes a material different from the material of the patterned mandrel layer 320 and is selected from silicon oxides, silicon nitrides, metal oxides, or polysilicon. In one example, the spacer layer 340 is a doped silicon-containing layer, such as boron doped silicon material, phosphorus doped silicon, or other suitable group-III, group-IV or group-V doped silicon material. In one example, the spacer layer 340 is a boron doped silicon layer.

In some implementations, the spacer layer 340 is formed by a CVD process. It is noted that the spacer layer 340 can be formed by any suitable deposition processes, such as PECVD, ALD, SACVD, HDPCVD, spin-on coating, or other suitable deposition techniques. In one example, the spacer layer 340 has a thickness from about 5 nm to about 25 nm.

In one example, the spacer layer 340 is conformally formed on the patterned mandrel layer 320, conformally lining on a top surface 322 and sidewalls 324 of the patterned mandrel layer 320. It is believed that the spacer layer 340 can provide good etching selectivity during the subsequent patterning process, so that a good profile of the spacer layer 340 after the patterning process can be obtained as needed.

Figure 3C:
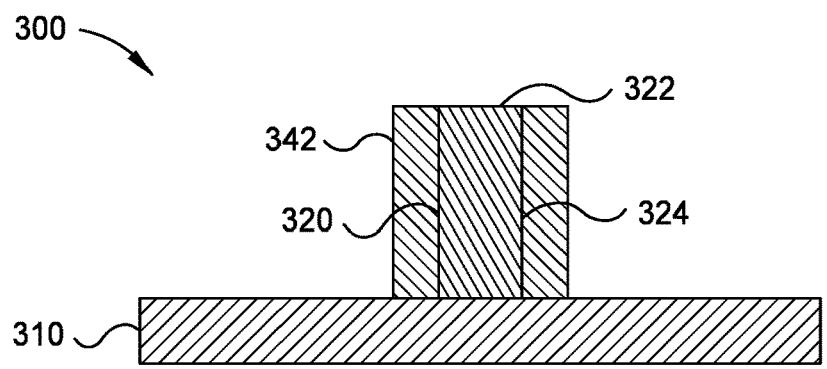

At operation 240, the spacer layer 340 is patterned as shown in FIG. 3C. The spacer patterning process of operation 240 can be performed in a plasma processing chamber, for example, the plasma processing chamber 100 shown in FIG. 1. The patterning process is performed by supplying a second gas mixture that can selectively remove portions of the spacer layer 340 with a targeted directionality so that certain portions (e.g., sidewalls 342) of the spacer layer 340 can remain on the substrate 310 with a targeted profile to form the spacer structure 350. In one example, the second gas mixture supplied during the spacer patterning process can include reactive etchants utilized for anisotropic etching of a silicon containing material from the spacer layer 340, particularly, to anisotropically etch a doped silicon containing material.

In some implementations, the second gas mixture includes a halogen containing gas selected from a group of HBr, chlorine gas ($Cl_2$), boron trichloride ($BCl_3$), nitrogen trifluoride ($NF_3$), sulfur hexafluoride gas ($SF_6$), carbon and fluorine containing gas, such as $CF_4$, $CHF_3$, $C_4F_8$, or a combinations thereof. In one example, the second gas mixture includes HBr and chlorine gas ($Cl_2$) utilized to etch the spacer layer 340. The second gas mixture is configured to remove the top portion and bottom portion of the spacer layer 340 without significantly attacking the sidewalls 342 of the spacer layer 340. In one example, the etching of the spacer layer 340 results in a substantially square top surface of the spacer structure 350.

Several process parameters are regulated while the second gas mixture is supplied into the plasma processing chamber. In one implementation, the chamber pressure in the presence of the second gas mixture is regulated. In one example, a process pressure in the plasma processing chamber is regulated from about 1 mTorr to about 80 mTorr, for example, from about 3 mTorr to about 60 mTorr. RF source and bias power can be applied to maintain a plasma formed from the second gas mixture. For example, RF source power of from about 100 Watts to about 3000 Watts (from about 200 Watts to about 1500 Watts; from about 200 Watts to about 1,000 Watts; or from about 500 Watts to about 3,000 Watts) can be applied to an inductively coupled antenna source to maintain a plasma inside the plasma processing chamber. RF bias power of about less than 1500 Watts (from about 40 Watts to 400 Watts; from about 150 Watts to about 400 Watts; or from about 500 Watts to about 1,500 Watts) can be applied while supplying the second gas mixture. The second gas mixture can be flowed into the chamber at a rate from about 50 sccm to about 1,000 sccm. A temperature of the substrate can be maintained from about −50 degrees Celsius to about 250 degrees Celsius, for example, from about −20 degrees Celsius to about 80 degrees Celsius.

While supplying the second gas mixture, the RF source and bias power range may be varied to facilitate predominately removing certain portions of the spacer layer 340. For example, the RF source power may be turned up, for example, from a first RF source power setting to a second RF source power setting, while the RF bias power may be turned down (e.g., from a first RF bias power setting to a second RF bias power setting) as needed while supplying the second gas mixture. In one example, after the first RF source and bias power setting has been performed for a time period for between about 5 seconds and about 20 seconds, the first RF source and bias power settings can be transitioned to the second RF source and bias power setting to continue the spacer patterning process. In one example, the second RF source power setting is from about 30% to about 80% higher than the first RF source power setting. The second bias power setting is from about 30 percent to about 70 percent less than the first bias power setting.

In one example, the first RF source power setting is from about 500 Watts to about 600 Watts and the first RF bias power setting is from about 50 Watts to about 150 Watts. The second RF source power setting is from about 700 Watts to about 900 Watts and the second RF bias power setting is from about 20 Watts to about 100 Watts.

Figure 3D:
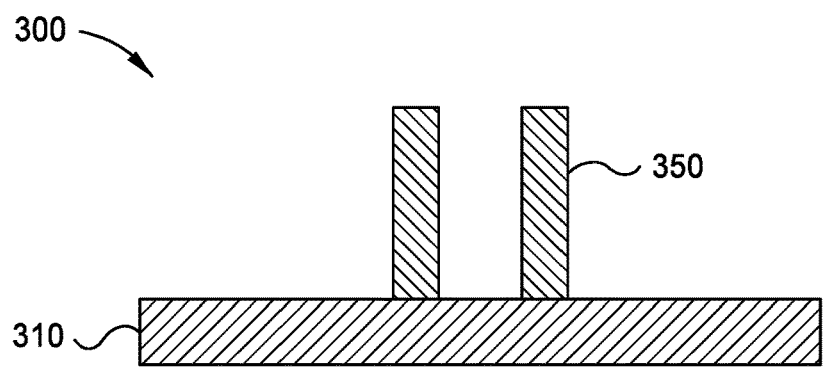

At operation 250, the patterned mandrel layer 320 is removed to form the spacer structure 350 as shown in FIG. 3D. The etch chemistry selected for removal of the patterned mandrel layer 320 can be selected based on the materials used to form the patterned mandrel layer 320 and the spacer layer 340.

In one example, the spacer patterning process can include one or more processing stages. For example, after the second gas mixture is supplied to predominately remove the top portion and the bottom portion of the spacer layer 340, a third gas mixture is supplied to predominately remove the patterned mandrel layer 320. The third gas mixture can include $O_2$, $H_2$, $H_2/N_2$, $Cl_2$, HBr, $H_2O$, $H_2O_2$, or a combination thereof and/or a carrier gas, such as $N_2$, He, Ar, and the like. The third gas mixture can include an oxygen-containing gas mixture and/or a carrier gas, such as $N_2$, He, Ar, and the like. In one example, a carbon and fluorine-containing gas, such as $CH_2F_2$, $CF_4$, and the like may also be utilized as needed. In one example, the second gas mixture includes $O_2$ and $N_2$ or $O_2$, $N_2$ and $CH_2F_2$.

Several process parameters can be regulated while the third gas mixture is supplied into the plasma processing chamber. In one implementation, the chamber pressure in the presence of the third gas mixture is regulated. In one example, a process pressure in the plasma processing chamber is regulated from about 1 mTorr to about 80 mTorr, for example, from about 3 mTorr to about 60 mTorr. RF source and bias power can be applied to maintain a plasma formed from the third gas mixture. For example, RF source power of from about 100 Watts to about 3000 Watts (from about 200 Watts to about 1500 Watts; from about 200 Watts to about 1,000 Watts; or from about 500 Watts to about 3,000 Watts) can be applied to an inductively coupled antenna source to maintain a plasma inside the plasma processing chamber. RF bias power of about less than 1500 Watts (from about 40 Watts to 400 Watts; from about 150 Watts to about 400 Watts; or from about 500 Watts to about 1,500 Watts) can be applied while supplying the third gas mixture. The third gas mixture can be flowed into the chamber at a rate from about 50 sccm to about 1,000 sccm. A temperature of the substrate can be maintained from about −50 degrees Celsius to about 250 degrees Celsius, for example, from about −20 degrees Celsius to about 80 degrees Celsius. The spacer structure 350 can be subjected to further processing.

Implementations using a tin-based mandrel can include one or more of the following potential advantages. Due to strong bonding of Sn—C, the Sn—C mandrel maintains a vertical profile even in small dimensions (e.g., <10 nm). Carbon, Sn or SnOx (oxidation in air) can be easily removed by dry plasmas etching or wet etchants, which provides accurate critical dimension control for multi-patterning.

Figure 4:
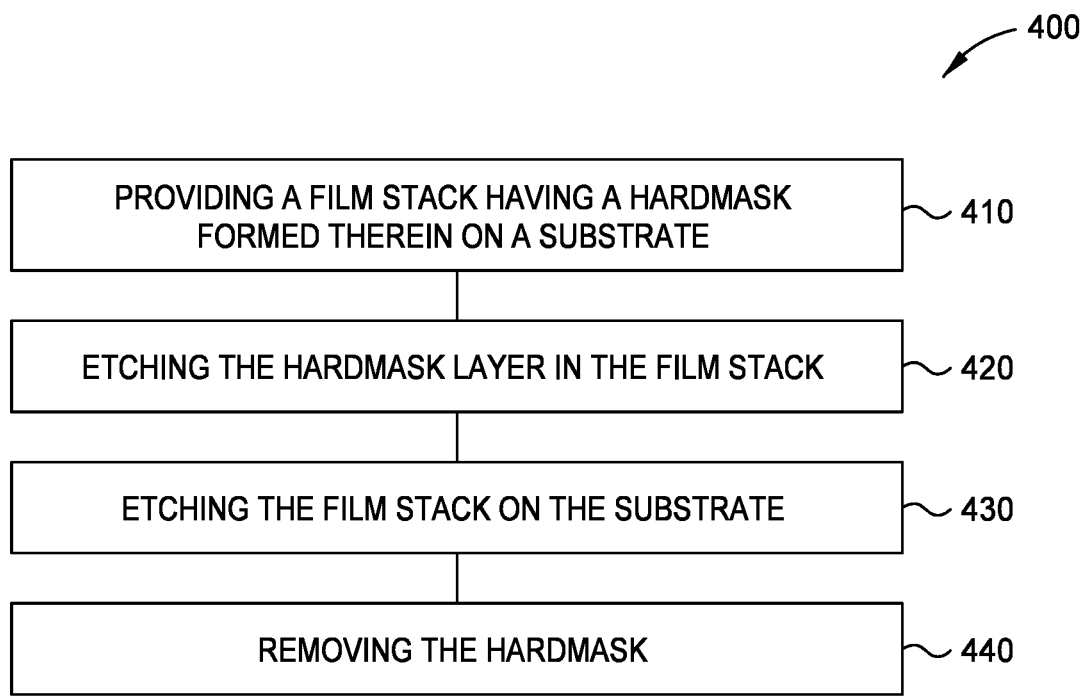
FIG. 4 illustrates a flow diagram of another method for performing a high aspect ratio feature patterning process according to one or more implementations of the present disclosure.

FIG. 4 illustrates a flow diagram of another method 400 for etching a film stack 500 having a tin-based hardmask layer 530. FIGS. 5A-5D illustrate cross-sectional views of the film stack 500 at various stages of a high aspect ratio feature patterning process according to the method 400. The method 400 can be utilized to form features with targeted critical dimensions and profiles, such as a contact structure, gate structure, NAND structure, or interconnection structure for logic or memory devices as needed. Alternatively, the method 400 may be beneficially utilized to etch other types of structures.

Figure 5A:
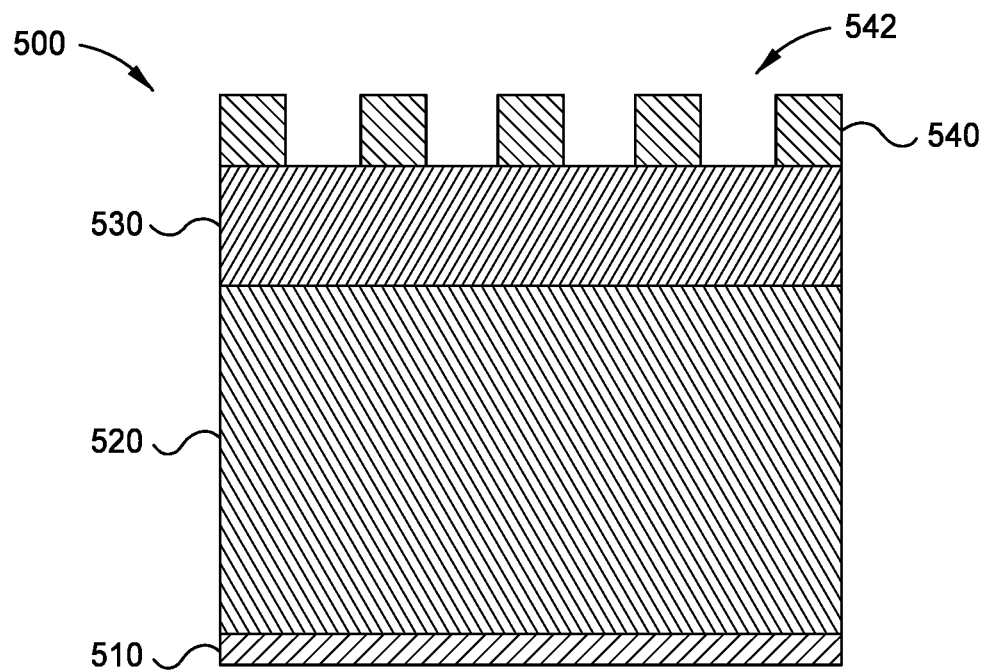
FIGS. 5A-5D illustrate various stages of a high aspect ratio feature patterning process according to one or more implementations of the present disclosure.

The method 400 begins at operation 410 by providing a film stack 500 having a hardmask layer 530 disposed on a plurality of layers 520 over a substrate 510 as shown in FIG. 5A.

The hardmask layer 530 includes tin-oxide (SnO, $SnO_2$) or tin-carbide (SnC) as described herein. In some implementations, the plurality of layers 520 includes multiple dielectric layers. In one example, the multiple dielectric layers include alternating oxide-nitride-oxide (ONO) layers. In another implementation, the plurality of layers 520 include alternating silicon and silicon germanium layers.

In some implementations, the hardmask layer 530 has a patterned photoresist layer 540 disposed thereon as shown in FIG. 5A. The patterned photoresist layer 540 can be a positive-tone photoresist and/or a negative-tone photoresist capable of undergoing a chemically amplified reaction. In one example, the patterned photoresist layer 540 is a polymer organic material suitable for an EUV lithography process. In one or more examples, the patterned photoresist layer 540 includes at least one metal element selected from at least one of Sn, Ta, In, Ga, Zr, Zn, any alloy thereof, or any combination thereof. The metal element included in the patterned photoresist layer 540 can alter the light absorption efficiency during a lithographic exposure process as needed.

The patterned photoresist layer 540 is disposed on the hardmask layer 530. In some implementations, the hardmask layer 530 is disposed on additional layers, for example, a bottom anti-reflective coating (BARC) layer and/or organic layers (not shown). The organic layer can include either an organic material or a mixture of organic and inorganic materials.

The hardmask layer 530 to be formed in the film stack 500 includes a tin-oxide or tin-carbide material. The hardmask layer 530 can include a single layer or multiple layers. In the example depicted in FIG. 5A, the hardmask layer 530 is a single layer containing or formed from tin-oxide, tin-carbide, or a combination thereof. In one or more examples, the hardmask layer 530 has a thickness from about 10 Å to about 500 Å, for example, about 20 Å to about 200 Å, for example, from about 50 Å to about 100 Å.

The hardmask layer 530 can be formed by any suitable deposition technique. In some implementations, the hardmask layer 530 is formed by CVD, ALD, PVD, or other suitable deposition processes.

In some implementations, the hardmask layer 530 is formed by a CVD or PVD process, a carrier gas and/or an inert gas with relatively higher atomic weight, such as Xe or Kr, can be used during the plasma deposition process of the hardmask layer 530. A substrate temperature controlled during formation of the hardmask layer 530 can be controlled from about −50 degrees Celsius to about 250 degrees Celsius. Not to be bound by theory, but it is believed that a relatively low substrate temperature control, for example, less than 250 degrees Celsius, while forming the hardmask layer 530 can help form the hardmask layer 530 at a relatively slow deposition rate, rendering a film surface with a relatively smooth surface.

The substrate 510 can be any one of semiconductor substrates, silicon wafers, glass substrates and the like. The substrate 510 can be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 510 can have various dimensions, such as 200-mm, 300-mm, 450-mm or other diameter, as well as, being a rectangular or square panel. Unless otherwise noted, examples described herein are conducted on substrates with a 200-mm diameter, a 300-mm diameter, or a 450-mm diameter.

Figure 5B:
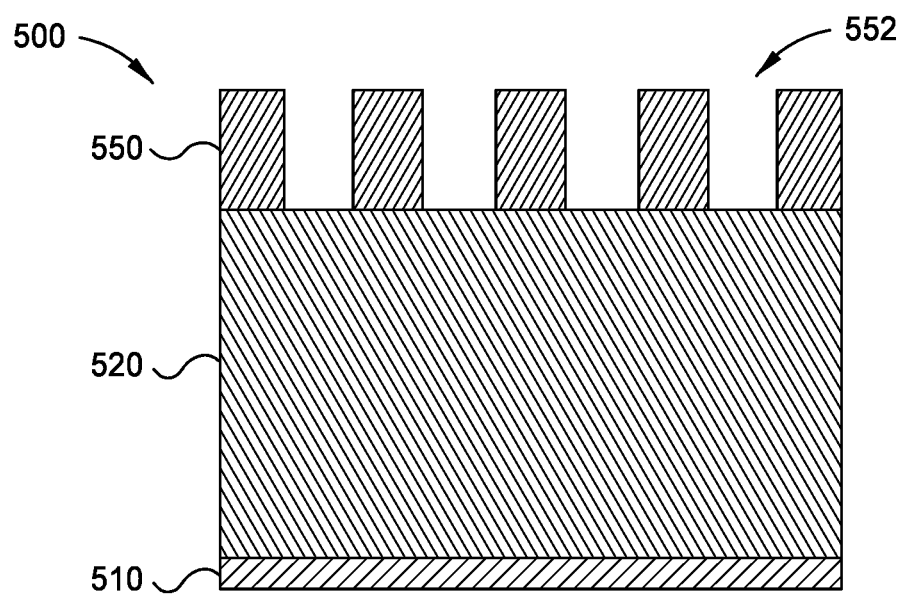

During operation 420, an etching process is performed to pattern the hardmask layer 530 to form the patterned hardmask layer 550 as shown in FIG. 5B. The hardmask layer 530 can be patterned using the patterned photoresist layer 540 having defined openings 542, exposing a portion of a surface of the hardmask layer 530 for etching. The patterned hardmask layer 550 has defined openings or features 552, exposing a portion of a surface of the plurality of layers 520. As the dimensions of the openings 542 defined by the patterned photoresist layer 540 are small, for example, less than 100-nm, a gas mixture as well as process parameters for etching the hardmask layer 530 are carefully selected to etch the hardmask layer 530 with good profile control without damaging the underlying plurality of layers 520.

In one or more examples, the etching process of operation 420 is performed by supplying a first etching gas mixture into the plasma processing chamber while maintaining a temperature of substrate support pedestal 135 from room temperature (e.g., about 23 degrees Celsius) up to about 150 degrees Celsius.

In some implementations, the first etching gas mixture includes at least one halogen-containing gas. The halogen-containing gas can include a fluorine-containing gas, a chlorine-containing gas, a bromine-containing gas, or a combination thereof. Suitable examples of the halogen-containing gas include $SF_6$, $SiCl_4$, $Si_2Cl_6$, $NF_3$, HBr, $Br_2$, $CHF_3$, $CH_2F_2$, $CF_4$, $C_2F$, $C_4F_6$, $C_3F_8$, HCl, $C_4F_8$, $Cl_2$, HF, $CCl_4$, $CHCl_3$, $CH_2Cl_2$, and $CH_3Cl$. In some examples, silicon-containing gas can also be supplied in the first etching gas mixture. Suitable examples of the silicon-containing gas include $SiCl_4$, $Si_2Cl_6$, $SiH_4$, $Si_2H_6$, and the like. Furthermore, particularly, examples of the chlorine-containing gas include HCl, $Cl_2$, $CCl_4$, $CHCl_3$, $CH_2Cl_2$, $CH_3Cl$, $SiCl_4$, $Si_2Cl_6$, and the like, and examples of the bromine-containing gas include HBr, $Br_2$, and the like. A reacting gas, such as an oxygen-containing gas or a nitrogen-containing gas, for example, $O_2$, $N_2$, $N_2O$, $NO_2$, $O_3$, $H_2O$, or the like can also be supplied in the first etching gas mixture as needed.

In some implementations, the halogen-containing gas used to etch the hardmask layer 530 includes a chlorine-containing gas or a bromine containing gas. While supplying the first etching gas mixture into the plasma processing chamber, an inert gas can be supplied into the etching gas mixture to assist the profile control as needed. Examples of the inert gas supplied in the gas mixture include Ar, He, Ne, Kr, Xe, or the like.

In one example, the first etching gas mixture utilized to etch the hardmask layer 530, such as tin-oxide or tin-carbide, includes HBr, $Cl_2$, Ar, He, or a combination thereof.

During operation 420, the chamber pressure of the first etching gas mixture is also regulated. In some implementations, a process pressure in the plasma processing chamber is regulated from about 2 mTorr to about 100 mTorr, for example, from about 3 mTorr to about 20 Torr, such as about 6 mTorr. RF source or bias power can be applied to maintain a plasma formed from a continuous mode or a pulsed mode as needed in presence of the first etching gas mixture. For example, a RF source power with a frequency of about 13.56 MHz can be applied at an energy level of from about 200 watts to about 1,000 watts, such as from about 500 watts, to an inductively coupled antenna source to maintain a plasma inside the plasma processing chamber. In addition, RF bias power, with a frequency of from about 2 MHz to about 13.56 MHz, can be applied at less than 500 watts, such as from about 0 watts to about 450 watts, such as about 150 watts.

In some implementations, the RF bias power and the RF source power can be pulsed in the plasma processing chamber during the etching of operation 420. The RF bias power and the RF source power can be synchronized or non-synchronized pulsed into the plasma processing chamber. In some examples, the RF bias power and the RF source power are non-synchronized pulsed into the plasma processing chamber. For example, the RF source power can be pulsed to the processing chamber prior to pulsing the RF bias power. For example, the RF bias power can be in pulse mode synchronized with the RF source power or with a time delay with respect to the RF source power. In some examples, the RF source power and the RF bias power are pulsed between about 5% and about 75% of each duty cycle. Each duty cycle, for example between each time unit is from about 0.1 milliseconds (ms) to about 10 ms.

In one example, the first etching gas mixture supplied at operation 220, includes 02 gas supplied into the chamber at a rate from about 0 sccm to about 50 sccm. The first etching gas mixture further includes the halogen-containing gas, such as HBr, supplied at a flow rate from about 25 sccm to about 250 sccm, such as about 100 sccm. In one example, the halogen-containing gas includes a fluorine-containing gas. Fluorine-based etching chemistry forms $SnF_4$, which is non-volatile to improve the selectivity during dielectric etching. $SnF_4$ or $SnO_2$ can be removed by hydrogen plasma to form $SnH_4$ or halogen based plasmas (e.g., $Cl_2/HBr$).

After the features 552 are formed in the hardmask layer 530, a de-scum or a strip process can be performed to remove the remaining patterned photoresist layer 540.

Figure 5C:
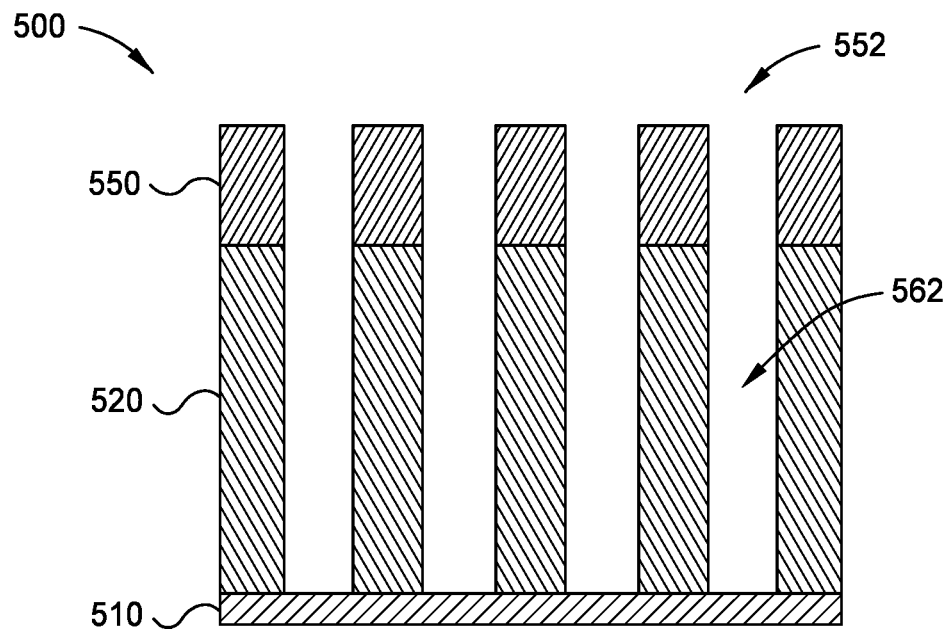

At operation 430, further etching or patterning can be performed to continue transferring features 552 into the plurality of layers 520 to form patterned plurality of layers 560 having features 562 formed therein as shown in FIG. 5C. In some implementations, the etching or patterning of operation 430 is performed using the first gas mixture of operation 420. In other implementations, the etching or patterning of operation 430 is performed using a second gas mixture, which is different than the first gas mixture used during operation 420. The second gas mixture can be selected based on the type of material used to form the patterned hardmask 550 and the type of material used to form the plurality of layers 520.

Figure 5D:
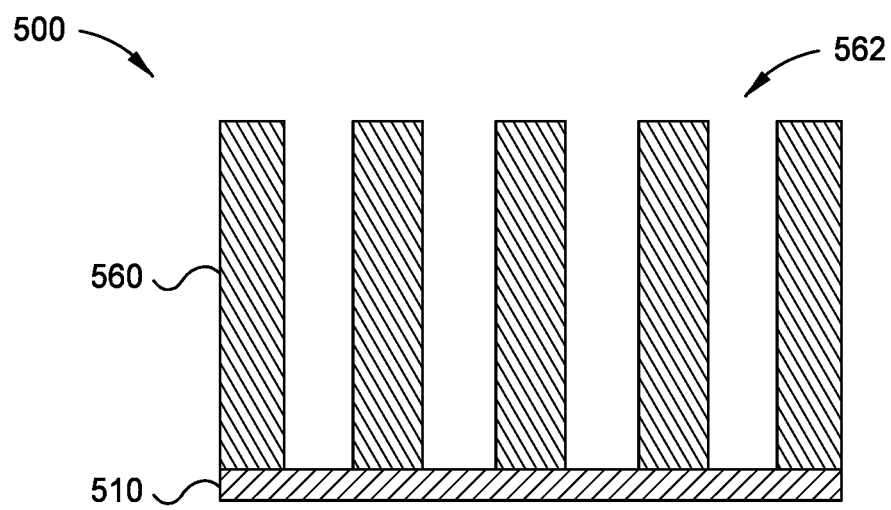

At operation 440, a hardmask removal process can be performed to remove the patterned hardmask 550 from the patterned plurality of layers 560 as shown in FIG. 5D. The stripping process of operation 440 can be very selective to silicon oxide and silicon nitride, which can lead to no change in the critical dimensions of the patterned plurality of layers 520.

Implementations using a tin-based hardmask can include one or more of the following potential advantages. Fluorine base etching chemistry forms $SnF_4$ which is non-volatile to improve the selectivity during dielectric etching. $SnF_4$ or $SnO_2$ can be removed by $H_2$ plasma to form $SnH_4$ or halogen based plasmas (e.g. $Cl_2/HBr$). Stripping process of tin-based hardmask films can be very selective to silicon oxide and silicon nitride (ONO structure post etch, no critical dimension change). Tin oxidation can be also selective removed by wet chemistries (e.g., HCl, $HNO_3$, or $H_2SO_4$).

Figure 6:
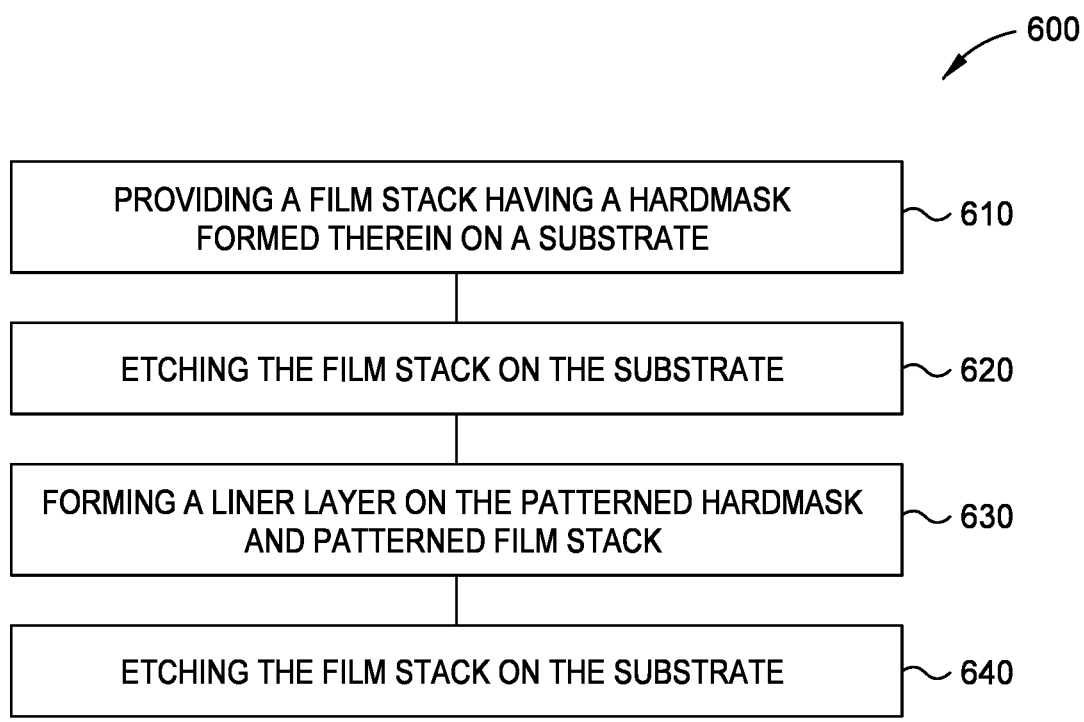
FIG. 6 illustrates a flow diagram of another method for performing a high aspect ratio feature patterning process according to one or more implementations of the present disclosure.

FIG. 6 illustrates a flow diagram of a method 600 for performing a high aspect ratio feature patterning process utilizing tin-based liner materials according to one or more implementations of the present disclosure. FIGS. 7A-7D illustrate cross-sectional views of a film stack 700 at various stages of a high aspect ratio feature patterning process according to the method 600. The method 600 may be utilized to form features with targeted critical dimensions and profiles, such as a contact structure, gate structure, NAND structure, or interconnection structure for logic or memory devices as needed. Alternatively, the method 600 may be beneficially utilized to etch other types of structures.

Figure 7A:
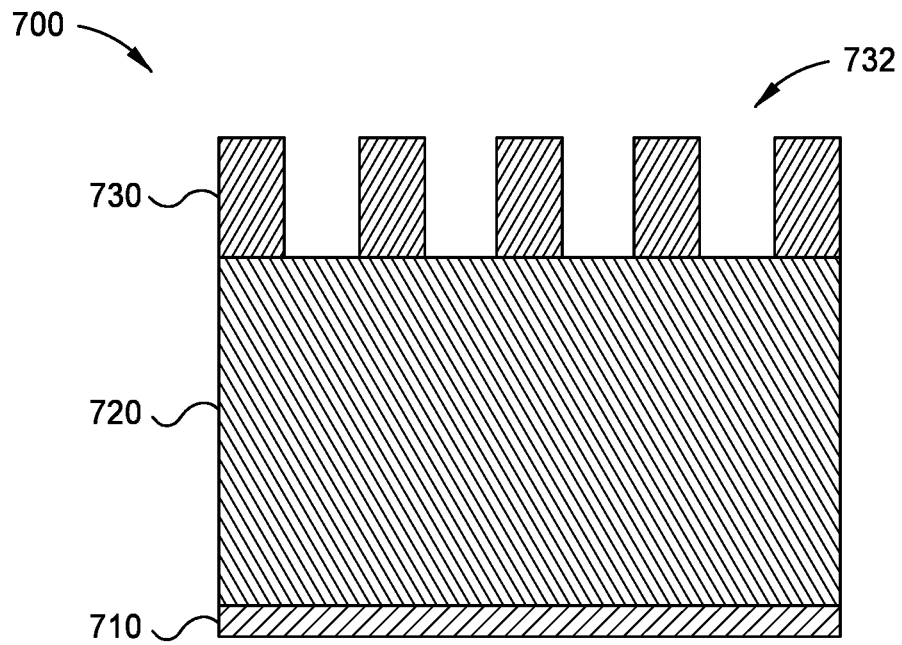
FIGS. 7A-7D illustrate various stages of a high aspect ratio feature patterning process according to one or more implementations of the present disclosure.

The method 600 begins at operation 610 by providing a film stack 700 having a patterned hardmask layer 730 disposed on a plurality of layers 720, which are disposed on a substrate 710, as shown in FIG. 7A. The patterned hardmask layer 730 can be patterned using a patterned photoresist layer (not shown) having defined openings, exposing a portion of the hardmask layer for etching. The patterned hardmask layer 730 has defined openings or features 732, exposing a portion of a surface of the plurality of layers 720.

In one example, the patterned hardmask layer 730 can be a first type of dielectric layer selected from a group of polysilicon, nanocrystalline silicon, amorphous silicon, silicon oxide, silicon nitride, silicon oxynitride, silicon carbide, silicon oxycarbide, amorphous carbon, diamond-like carbon, titanium nitride, titanium oxide, titanium oxynitride, tantalum nitride, tantalum oxide, tantalum oxynitride, or any other suitable materials. In one particular example, the first type of dielectric layer selected to form the patterned hardmask layer 730 is a carbon-containing layer, such as amorphous carbon, diamond-like carbon, SiOC, or the like.

The patterned hardmask layer 730 can be formed using any suitable patterning process.

Figure 7B:
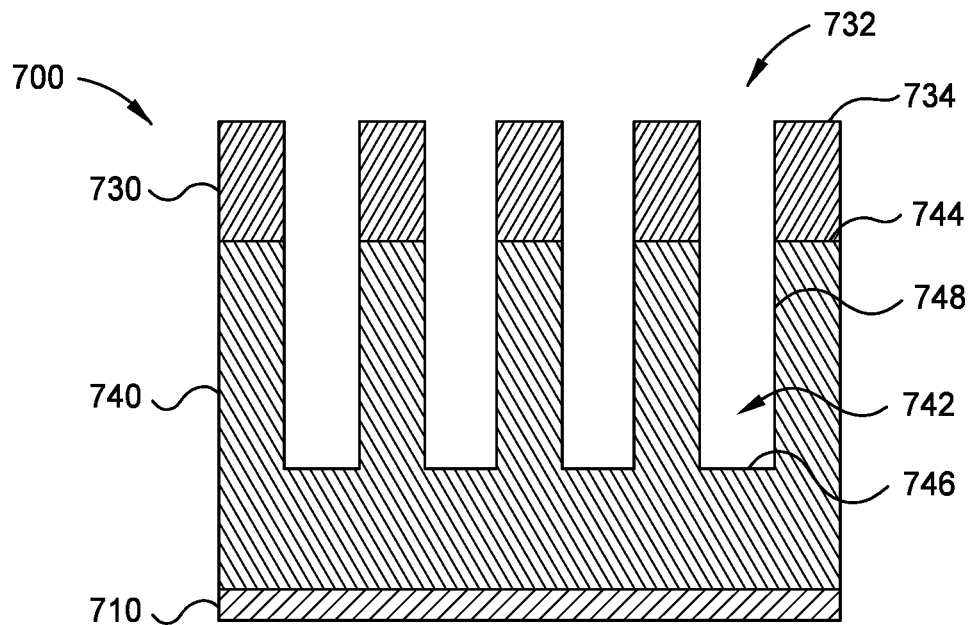

At operation 620, further etching or patterning can be performed to continue transferring features 732 into the plurality of layers 720 to form patterned plurality of layers 740 having feature 742 formed therein as shown in FIG. 7B. The feature 742 extends a feature depth from a top surface 744 of the patterned plurality of layers 740 to a bottom surface 746 of the feature 742. The feature 742 has a width defined by at least one sidewall 748.

Any suitable etching or patterning process can be performed to form the patterned plurality of layers 740. The etching or patterning of operation 620 can be performed using a gas mixture, which is selected based on the type of material used to form the patterned hardmask layer 730 and the type of material used to form the plurality of layers 720. In some implementations, the etching or patterning of operation 620 is performed using a gas mixture and etching conditions similar to the first gas mixture and etching conditions of operation 420. In other implementations, the etching or patterning of operation 620 is performed using a gas mixture and processing conditions, which are different from the first gas mixture and etching conditions used during operation 420.

Figure 7C:
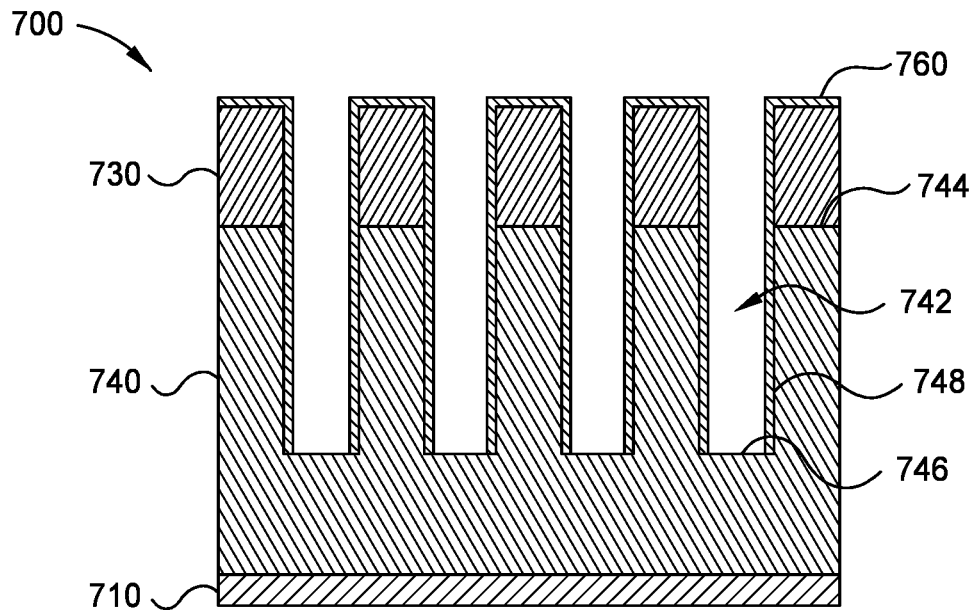

At operation, 630 a liner layer 760 is formed on the patterned hardmask layer 730 (if present) and the patterned plurality of layers 740, as shown in FIG. 7C. The liner layer 760 is a tin-based liner layer. The liner layer 760 includes tin-oxide, tin-carbide, or a combination thereof. The liner layer 760 can be viewed as another spacer layer (e.g., a spacer-on-spacer scheme) that assists in reducing dimensions of the openings 742 as defined therebetween with reduced dimensions as needed. The liner layer 760 can be formed by CVD, ALD, or any other suitable deposition techniques. In one example, the liner layer 760 is a tin-oxide layer or a tin-carbide layer formed by an ALD process. It is noted that the liner layer 760 as depicted in FIG. 7C is conformally formed on the patterned hardmask layer 730 and the patterned plurality of layers 740, conformally lining a top surface 734 of the patterned hardmask layer 730 and the sidewalls 748 of the patterned plurality of layers 740. The liner layer 760 further reduces the dimension of the feature 742 defined between the sidewalls 748, which can be further utilized as a mask layer to transfer features to the underlying layers or unpatterned portions of the patterned plurality of layers 740 with reduced small dimensions as needed. In one example, the liner layer 760 has a thickness from about 1 nm to about 10 nm, for example, from about 2 nm to about 5 nm.

Figure 7D:
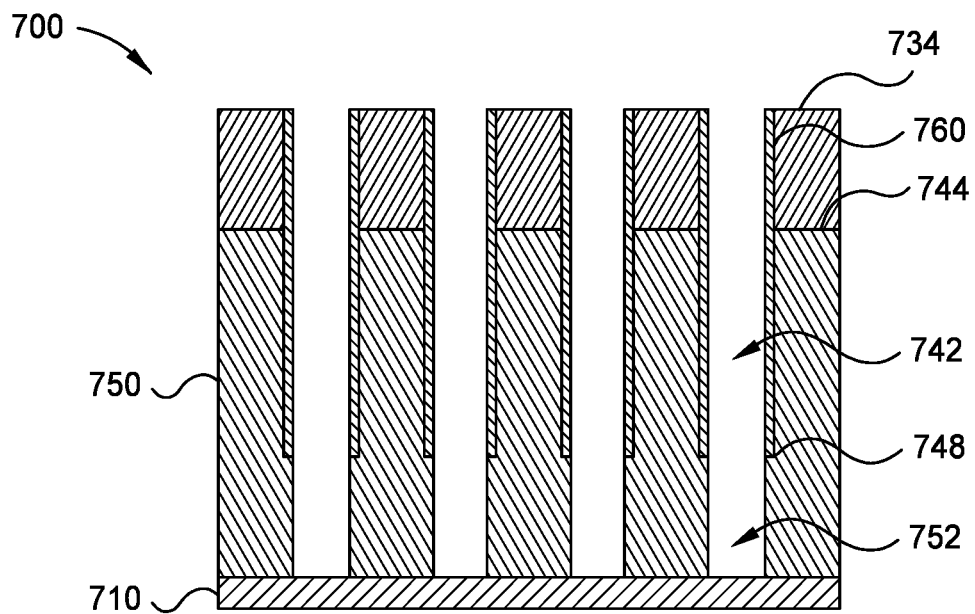

At operation 640, another patterning process is performed to transfer features 742 to the underlying layers or unpatterned portions of the patterned plurality of layers 740 to form features 752 with reduced small dimensions as needed as shown in FIG. 7D. During operation 640, a portion of the liner layer 760 may be removed, for example, the liner layer 760 formed on the top surface 734 of the patterned hardmask layer 730. The liner layer 760 and unpatterned portions of the patterned plurality of layers 740 undergoes anisotropic etching or patterning until feature 752 is formed. The patterning process of operation 640 can be similar to the patterning process performed at operation 240. In some implementations, operation 640 results in a top surface of the substrate 710 being exposed.

Implementations using a tin-based liner can include one or more of the following potential advantages. The tin-based liner can reduce or prevent dielectric via hole bowing in critical dimensions. The tin-based liner can be easily removed in wet or dry plasma without damaging the critical dimension of the feature.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, such as, one or more computer programs tangibly embodied in a machine readable storage device, for execution by, or to control the operation of, data processing apparatus, for example, a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of forming features on a substrate, comprising:
   forming a hardmask layer on a film stack formed over a substrate, wherein the hardmask layer comprises tin-oxide or tin carbide and the film stack comprises oxide-nitride-oxide (ONO) layers;
   disposing a patterned photoresist layer on the hardmask layer having openings therethrough;
   supplying a first etching gas mixture into a processing chamber containing the substrate; and
   etching the hardmask layer exposed by the openings of the patterned photoresist layer to form a patterned hardmask layer.

2. The method of claim 1, further comprising:
   supplying a second etching gas mixture into a processing chamber containing the substrate; and
   etching the film stack exposed by the patterned hardmask layer.

3. The method of claim 1, wherein the first etching gas mixture comprises a halogen-containing gas.

4. The method of claim 3, wherein the halogen-containing gas is selected from $Cl_2$ gas, HBr gas, or a combination thereof.

5. The method of claim 4, wherein the first etching gas mixture further comprises a passivation gas selected from $N_2$, $O_2$, COS, $SO_2$, or a combination thereof.

6. A method of forming features on a substrate, comprising:
   forming a hardmask layer on a film stack formed over a substrate, wherein the hardmask layer comprises tin-oxide or tin carbide and the film stack comprises alternating layers of silicon and silicon germanium;
   disposing a patterned photoresist layer on the hardmask layer having openings therethrough;
   supplying a first etching gas mixture into a processing chamber containing the substrate; and
   etching the hardmask layer exposed by the openings of the patterned photoresist layer to form a patterned hardmask layer.

7. A method of forming features on a substrate, comprising:
- forming a patterned hardmask layer on a film stack formed over a substrate, wherein the patterned hardmask layer comprises carbon and the film stack comprises oxide-nitride-oxide (ONO) layers;
- supplying a first etching gas mixture into a processing chamber containing the substrate;
- etching the film stack exposed by the hardmask layer to form a patterned film stack;
- forming a liner layer on the patterned hardmask layer and the patterned film stack exposed between the patterned hardmask layer, wherein the liner layer comprises tin-oxide or tin-carbide, and
- exposing the liner layer to wet chemistry or dry plasma to remove the liner layer and the patterned filmstack exposed between the patterned hardmask layer.

8. A method of forming features on a substrate, comprising:
- forming a patterned hardmask layer on a film stack formed over a substrate, wherein the patterned hardmask layer comprises carbon and the film stack comprises alternating layers of silicon and silicon germanium;
- supplying a first etching gas mixture into a processing chamber containing the substrate;
- etching the film stack exposed by the hardmask layer to form a patterned film stack;
- forming a liner layer on the patterned hardmask layer and the patterned film stack exposed between the patterned hardmask layer, wherein the liner layer comprises tin-oxide or tin-carbide, and
- exposing the liner layer to wet chemistry or dry plasma to remove the liner layer and the patterned filmstack exposed between the patterned hardmask layer.

* * * * *